United States Patent
Li et al.

(10) Patent No.: US 6,911,403 B2
(45) Date of Patent: Jun. 28, 2005

(54) METHODS OF REDUCING PLASMA-INDUCED DAMAGE FOR ADVANCED PLASMA CVD DIELECTRICS

(75) Inventors: Lihua Li, San Jose, CA (US); Tsutomu Tanaka, Santa Clara, CA (US); Tzu-Fang Huang, San Jose, CA (US); Li-Qun Xia, Santa Clara, CA (US); Dian Sugiarto, Sunnyvale, CA (US); Visweswaren Sivaramakrishnan, Santa Clara, CA (US); Peter Wai-Man Lee, San Jose, CA (US); Mario David Silvetti, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 10/645,675

(22) Filed: Aug. 20, 2003

(65) Prior Publication Data

US 2005/0042885 A1 Feb. 24, 2005

(51) Int. Cl.[7] .............................................. H01L 21/31
(52) U.S. Cl. ..................... 438/778; 438/783; 438/788
(58) Field of Search ................................. 438/778, 783, 438/787, 788; 428/447; 427/255.28

(56) References Cited

U.S. PATENT DOCUMENTS

| | | | |
|---|---|---|---|
| 5,271,972 A | 12/1993 | Kwok et al. ................. | 427/579 |
| 5,540,821 A | 7/1996 | Tepman .................. | 204/192.13 |
| 5,728,259 A | 3/1998 | Suzawa et al. ........... | 156/646.1 |
| 6,159,871 A | 12/2000 | Loboda et al. ............... | 438/786 |
| 6,521,302 B1 | 2/2003 | Campana-Schmitt et al. .... | 427/574 |
| 2001/0014520 A1 | 8/2001 | Usui et al. .................... | 438/586 |
| 2002/0029853 A1 | 3/2002 | Hudson et al. .............. | 156/345 |
| 2003/0092284 A1 | 5/2003 | Huang et al. ................ | 438/763 |
| 2003/0124874 A1 | 7/2003 | Matsuki ...................... | 438/778 |
| 2004/0137243 A1 * | 7/2004 | Gleason et al. ............. | 428/447 |
| 2004/0161536 A1 * | 8/2004 | Lang et al. ............ | 427/255.28 |
| 2004/0203223 A1 * | 10/2004 | Guo et al. ................... | 438/637 |
| 2004/0249006 A1 * | 12/2004 | Gleason et al. ............... | 521/61 |

FOREIGN PATENT DOCUMENTS

| | | | | |
|---|---|---|---|---|
| EP | 1 191 569 | 3/2002 | ......... | H01L/37/32 |
| JP | 2002 176047 | 6/2002 | ............ | H01L/2/31 |

* cited by examiner

*Primary Examiner*—Tuan H. Nguyen
(74) *Attorney, Agent, or Firm*—Moser, Patterson & Sheridan (57) ABSTRACT

A method for depositing an organosilicate layer on a substrate includes varying one or more processing conditions during a process sequence for depositing an organosilicate layer from a gas mixture comprising an organosilicon compound in the presence of RF power in a processing chamber. In one aspect, the distance between the substrate and a gas distribution manifold in the processing chamber is varied during processing. Preferably, the method of depositing an organosilicate layer minimizes plasma-induced damage to the substrate.

31 Claims, 8 Drawing Sheets

METHODS OF REDUCING PLASMA-INDUCED DAMAGE FOR ADVANCED PLASMA CVD DIELECTRICS

BACKGROUND OF THE INVENTION

1. Field of the Invention

Embodiments of the present invention generally relate to the fabrication of integrated circuits. More particularly, embodiments of the present invention relate to a method for depositing organosilicate layers on a substrate.

2. Description of the Related Art

In the manufacture of integrated circuits, plasma processes are increasingly being used to replace thermal processes. Plasma processing provides several advantages over thermal processing. For example, plasma enhanced chemical vapor deposition (PECVD) allows deposition processes to be performed at substantially lower temperatures than the temperatures required for analogous thermal processes. This is advantageous for processes with stringent thermal budget demands, such as in very large scale or ultra-large scale integrated circuit (VLSI or ULSI) device fabrication.

However, one problem that has been encountered with plasma processing in integrated circuit fabrication is device damage that occurs as a result of exposure of a device to plasma conditions. It is believed that a non-uniform plasma environment may result in electric field gradients that lead to device damage.

While the susceptibility or degree of device damage typically depends at least partially on the stage of device fabrication and the type of device, many types and stages of devices can experience plasma-induced damage (PID). However, in particular, devices containing an insulating or dielectric layer deposited on a substrate are often susceptible to PID, as charges accumulate on the surface of the dielectric layer. Furthermore, as the size of device features is becoming smaller, dielectric layers are becoming thinner, and devices are becoming increasingly susceptible to PID.

Therefore, there is a need for a method of plasma processing that reduces or minimizes plasma-induced damage to devices.

SUMMARY OF THE INVENTION

Embodiments of the invention provide a method for depositing an organosilicate layer on a substrate such that plasma-induced damage to the substrate is minimized. In one embodiment, a method of depositing an organosilicate layer on a substrate includes reacting a gas mixture comprising an organosilicon compound in a processing chamber in the presence of RF power to deposit an organosilicate layer on a substrate disposed on a substrate support in the processing chamber, wherein the conditions comprise varying a distance between the substrate and a gas manifold of the processing chamber during the deposition process. The distance between the substrate and the gas manifold may be varied one or more times during the deposition process. In a preferred embodiment, the deposition process includes three different spacings between the substrate and the gas distribution manifold.

In another embodiment, a method of depositing an organosilicate layer on a substrate includes initiating RF power in a processing chamber, introducing an organosilicon compound into the chamber after the RF power is initiated, and reacting a gas mixture comprising the organosilicon compound in the processing chamber in the presence of RF power to deposit an organosilicate layer on a substrate disposed on a substrate support in the processing chamber.

In a further embodiment, a method of depositing an organosilicate layer on a substrate includes reacting a gas mixture comprising an organosilicon compound in the processing chamber in the presence of RF power to deposit an organosilicate layer on a substrate disposed on a substrate support in the processing chamber, terminating the flow of the organosilicon compound into the chamber, and then terminating the RF power in the chamber.

In further embodiments, a method of depositing an organosilicate layer on a substrate includes reacting a gas mixture comprising an organosilicon compound in the processing chamber in the presence of RF power to deposit an organosilicate layer on a substrate disposed on a substrate support in the processing chamber, wherein the RF power is initiated by ramping up the RF power or the RF power is terminated by ramping down the RF power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention provide a method of depositing an organosilicate layer on a substrate that reduces plasma-induced damage to the substrate. Generally, one or more processing conditions are varied during the deposition of the organosilicate layer such that plasma-induced damage to the substrate is minimized.

In one embodiment, a method of depositing an organosilicate layer on a substrate such that plasma-induced damage to the substrate is minimized includes varying the distance between the substrate and a gas distribution manifold of the processing chamber in which the organosilicate layer deposition is performed. This embodiment will be further described with respect to FIGS. 1 and 2.

Figure 1:
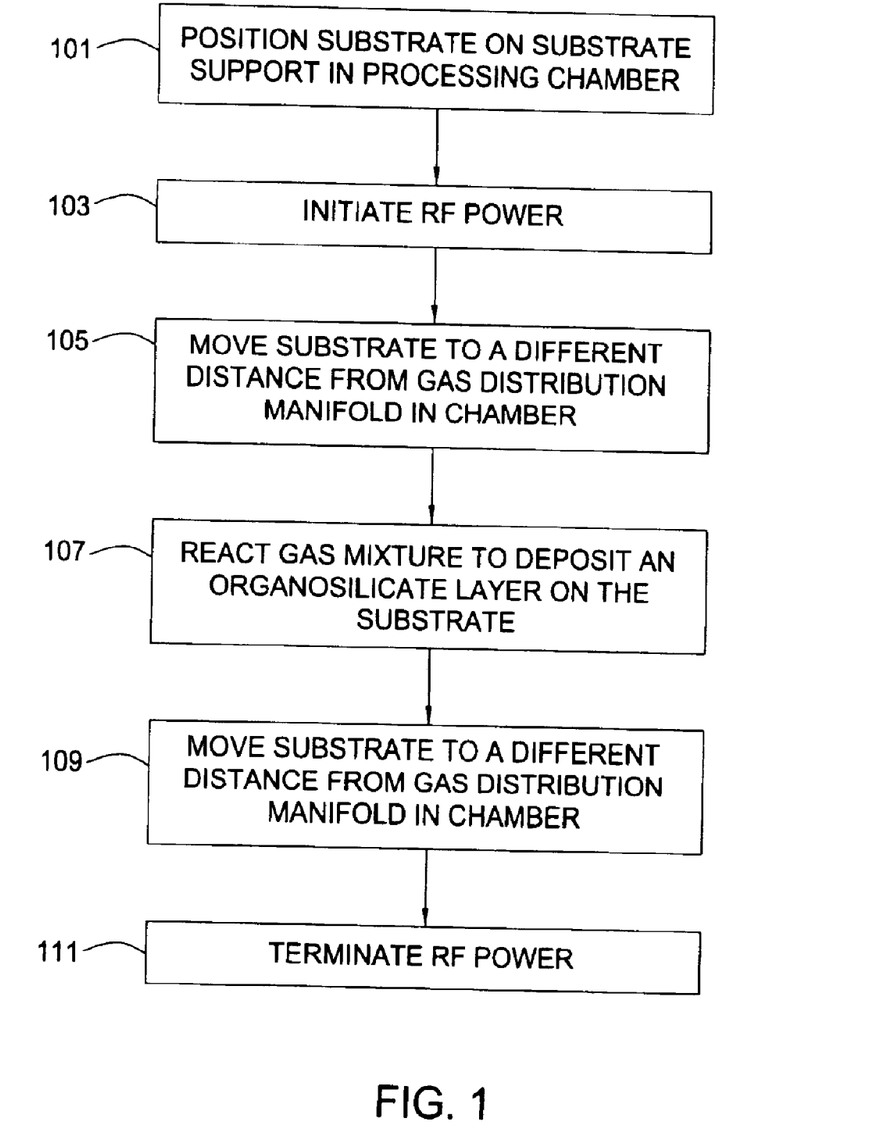
FIG. 1 is a process flow diagram illustrating a first method incorporating an embodiment of the invention.

FIG. 1 is a process flow diagram illustrating a first embodiment of the invention. In step 101, a substrate is positioned on a substrate support in a processing chamber. In step 103, RF power is initiated in the chamber in order to provide plasma processing conditions in the chamber. In step 105, the substrate is moved such that it is located at a different distance from a gas distribution manifold of the chamber during the following step 107 than during step 103. A gas mixture introduced into the chamber before the initiation of RF power and comprising an organosilicon compound is reacted in the chamber in the presence of RF power to deposit an organosilicate layer on the substrate in step 107. In step 109, the substrate is moved such that it is located at a different distance from the gas distribution manifold during the following step 111 than during step 107. The RF power is terminated in step 111. The chamber pressure is maintained during the RF power termination, such as by not opening the chamber throttle valve.

Although FIG. 1 includes two steps, 105 and 109, in which the distance between the substrate and the gas distribution manifold of the chamber is varied, in other embodiments, only one of steps 105 and 109 is performed. For example, in one embodiment, the distance between the substrate and the gas distribution manifold is changed immediately after the initiation of RF power is completed and is not changed during the deposition of the organosilicate layer or during the termination of the RF power. In another embodiment, the distance between the substrate and the gas distribution manifold remains constant during the initiation of RF power and during the deposition of the organosilicate layer and then is changed prior to the termination of the RF power.

Figure 2:
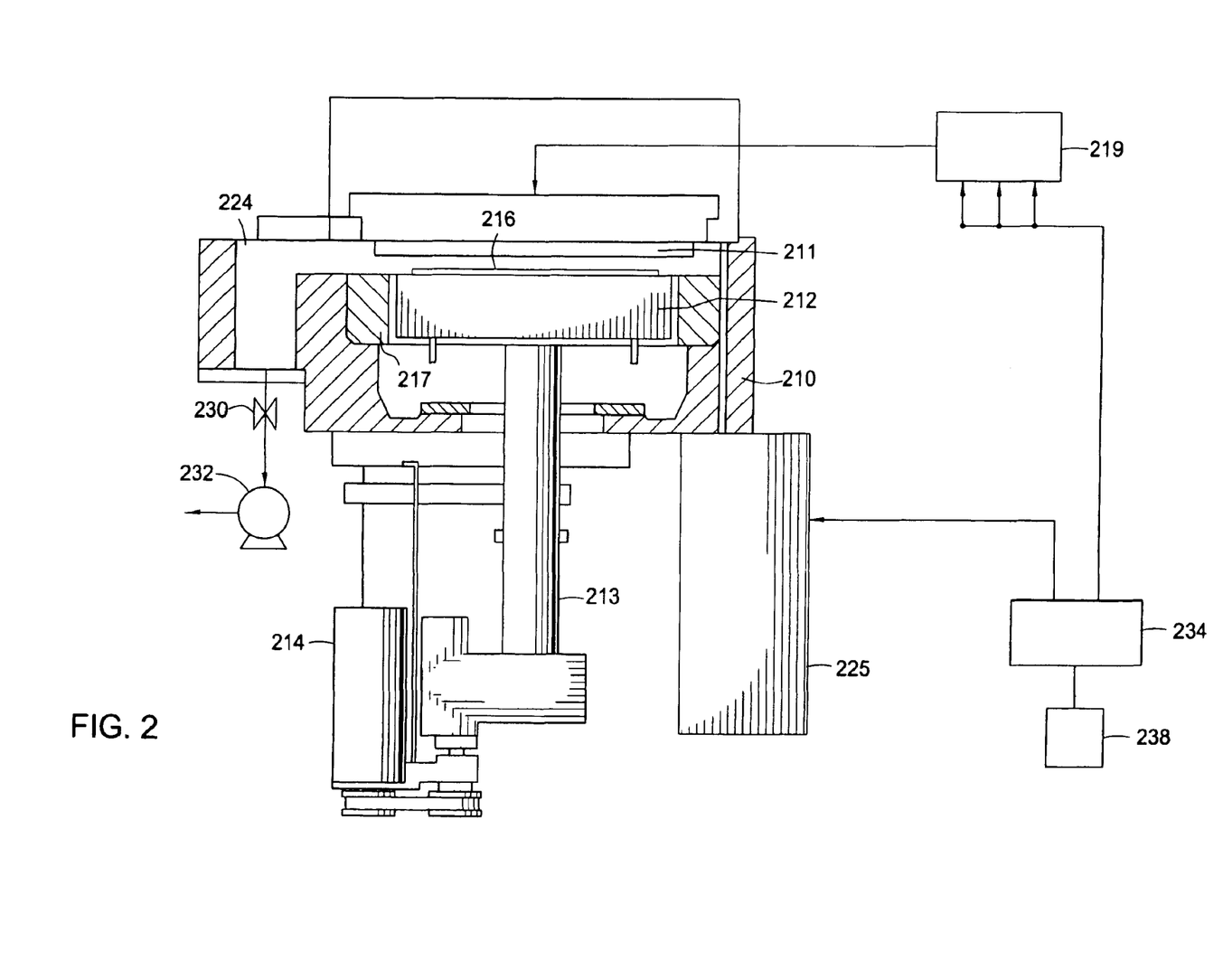
FIG. 2 is a cross-sectional diagram of an exemplary processing chamber that may be used for practicing embodiments of the invention.

FIG. 2 is a cross-sectional schematic view of a chemical vapor deposition (CVD) chamber 210 that is suitable for practicing embodiments of the invention. One example of such a chamber 210 is a DxZ® chamber used with a CENTURA® platform or in a PRODUCERS system (with dual chambers), all of which are available from Applied Materials, Inc., of Santa Clara, Calif.

The process chamber 210 contains a gas distribution manifold 211, typically referred to as a "showerhead", for dispersing process gases through perforated holes (not shown) in the manifold 211 to a substrate 216 that rests on a substrate support 212. Gas flow controllers 219 are typically used to control and regulate the flow rates of different process gases into the process chamber 210 through the gas distribution manifold 211. Other flow control components may include a liquid flow injection valve and liquid flow controller (not shown) if liquid precursors are used. The substrate support 212 is resistively heated and is mounted on a support stem 213, so that the substrate support 212 and the substrate 216 can be controllably moved by a lift motor 214 between a lower loading/off-loading position and an upper processing position adjacent to the gas distribution manifold 211. When the substrate support 212 and the substrate 216 are in a processing position, they are surrounded by an insulator ring 217.

During processing, process gases are uniformly distributed radially across the substrate surface. The gases are exhausted through a port 224 by a vacuum pump system 232, with the gas throughput or chamber pressure being regulated by a throttle valve 230. A plasma is formed from one or more process gas or a gas mixture by applying radio-frequency (RF) energy from a RF power supply 225 to the gas distribution manifold 211, which acts as an electrode. Film deposition takes place when the substrate 216 is exposed to the plasma and the reactive gases provided therein. The substrate support 212 and chamber walls are typically grounded. The RF power supply 225 can supply either a single or mixed-frequency RF signal to the gas distribution manifold 211 to enhance the decomposition of any gases introduced into the chamber 210. When a single frequency RF signal is used, e.g., between about 350 kHz and about 60 MHz, a power between about 1 and about 2,000 W can be applied to the gas distribution manifold 211.

A system controller 234 controls the functions of various components such as the power supplies, lift motors, flow controllers for gas injection, vacuum pump, and other associated chamber and/or processing functions. The system controller 234 executes system control software stored in a memory 238, which in the preferred embodiment is a hard disk drive, and can include analog and digital input/output boards, interface boards, and stepper motor controller boards. Optical and/or magnetic sensors are generally used to move and determine the position of movable mechanical assemblies. An example of such a CVD process chamber is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention. The disclosure of this patent is incorporated herein by reference.

The above CVD system description is mainly for illustrative purposes, and other plasma processing chambers may also be employed for practicing embodiments of the invention.

Figure 3:
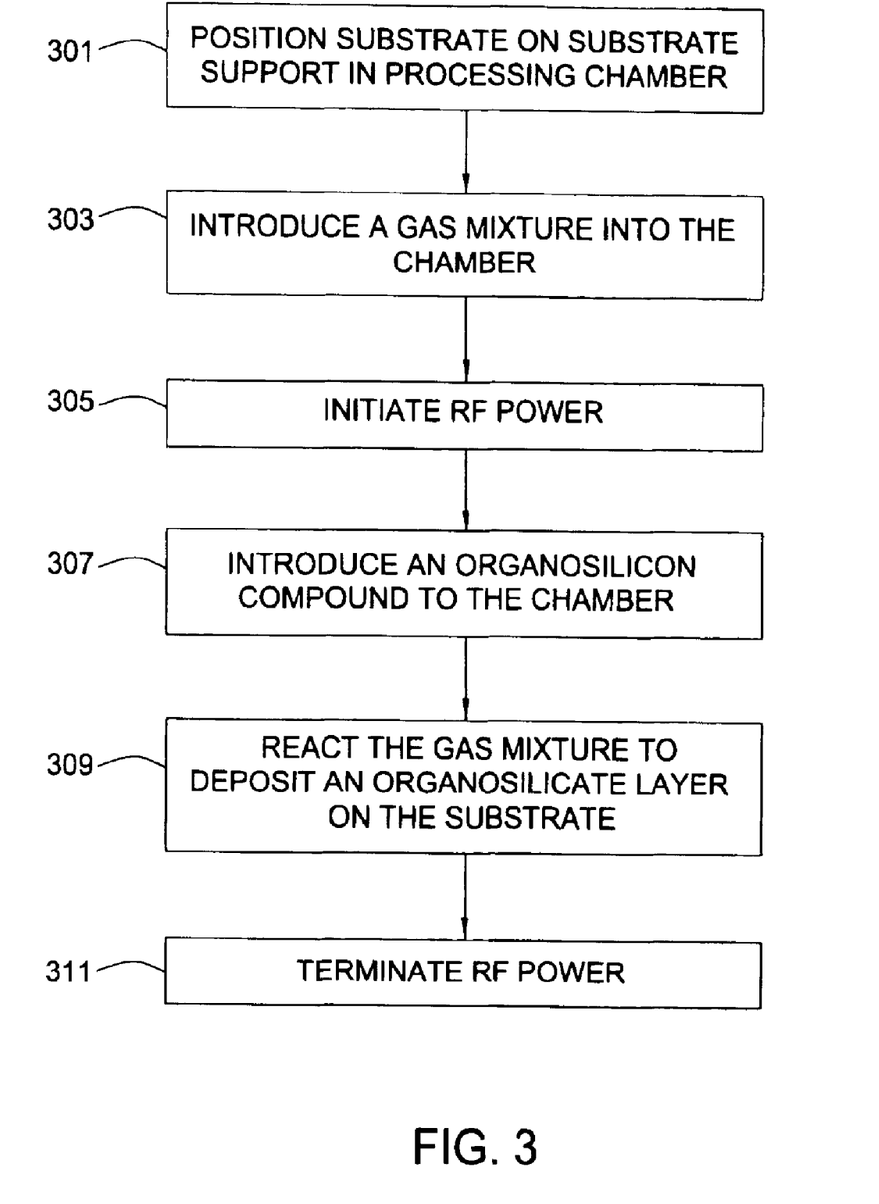
FIG. 3 is a process flow diagram illustrating a second method incorporating an embodiment of the invention.

FIG. 3 is a flow diagram of a second embodiment of the invention that may be performed using a processing chamber such as the processing chamber shown in FIG. 2. In the embodiment shown in FIG. 3, the organosilicate layer is deposited from a gas mixture comprising an organosilicon compound, wherein the flow of the organosilicon compound into the processing chamber is not introduced into the processing chamber before the RF power is initiated. In step 301, a substrate is positioned on a substrate support in a processing chamber. In step 303, a gas mixture that is used to deposit the organosilicate layer, excluding the organosilicon compound, is introduced into the processing chamber. In step 305, RF power is initiated in the chamber in order to provide plasma processing conditions in the chamber. In step 307, the organosilicon compound is introduced into the processing chamber after the initiation of RF power. The gas mixture including the organosilicon compound is reacted in the chamber in the presence of RF power to deposit an organosilicate layer on the substrate in step 309. The RF power is terminated in step 311. The chamber pressure is maintained during the RF power termination, such as by not opening the chamber throttle valve.

Figure 4:
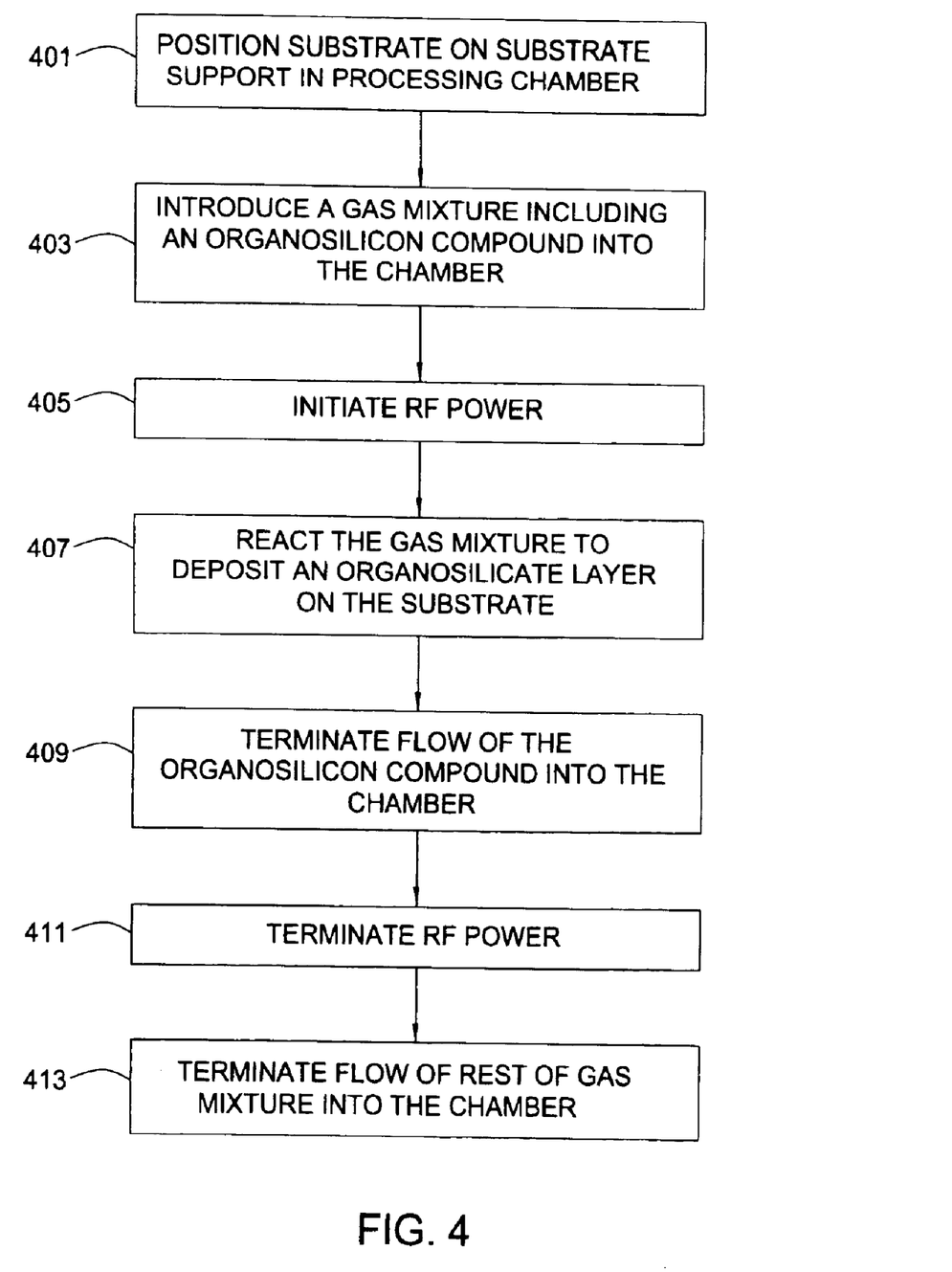
FIG. 4 is a process flow diagram illustrating a third method incorporating an embodiment of the invention.

FIG. 4 is a flow diagram of a third embodiment of the invention. In the embodiment shown in FIG. 4, an organosilicate layer is deposited from a gas mixture comprising an organosilicon compound, wherein the flow of the organosilicon compound into the processing chamber is terminated before the flow of the other components of the gas mixture into the chamber and the RF power are terminated. In step 401, a substrate is positioned on a substrate support in a processing chamber. In step 403, a gas mixture including an organosilicon compound is introduced into the chamber. In step 405, RF power is initiated in the chamber in order to provide plasma processing conditions in the chamber. A gas mixture comprising the organosilicon compound is reacted in the chamber in the presence of RF power to deposit an organosilicate layer on the substrate in step 407. The flow of the organosilicon compound into the chamber is terminated in step 409. The RF power is terminated in step 411 after the termination of the flow of the organosilicon compound into the chamber. The chamber pressure is maintained during the RF power termination, such as by not opening the chamber throttle valve. The flow of the components of the gas mixture, excluding the organosilicon compound, is terminated in step 413.

The combination of the steps of FIGS. 3 and 4 provides another embodiment of the invention. A substrate is positioned on a substrate support in a processing chamber, a gas mixture is introduced into the processing chamber, RF power is initiated in the processing chamber to provide plasma processing conditions in the chamber, an organosilicon compound is introduced into the processing chamber, and the gas mixture comprising the organosilicon compound is reacted in the chamber in the presence of RF power to deposit an organosilicate layer on the substrate, as shown in steps 301–309 of FIG. 3. Then, the flow of the organosilicon compound into the chamber is terminated and the RF power is terminated, as shown in steps 409–411 of FIG. 4.

While the methods of reducing plasma-induced damage described above each include varying one process variable during the deposition of an organosilicate layer, such as the distance between the substrate and the gas distribution manifold, and the timing of the initiation and/or termination of the flow of the organosilicon compound into the chamber, further embodiments include varying more than one of these variables. In one example, both the distance between the substrate and the gas distribution manifold and the timing of the termination of the flow of the organosilicon compound into the chamber were altered. For example, in one embodiment, a substrate is positioned on a substrate support in a processing chamber, RF power is initiated in the chamber in order to provide plasma processing conditions in the chamber, a gas mixture comprising an organosilicon compound is reacted in the chamber in the presence of RF power to deposit an organosilicate layer on the substrate, the flow of the organosilicon compound into the chamber is terminated, and then the substrate is moved to a different distance from the gas distribution manifold and the RF power and the flow of the rest of the gas mixture into the chamber are terminated.

In other embodiments, in addition to varying the distance between the substrate and the gas distribution manifold and/or varying the timing of the initiation or termination of the flow of the organosilicon compound into the chamber, a method of depositing an organosilicate layer on a substrate such that plasma-induced damage to the substrate is minimized includes varying the RF power at the initiation and/or termination of the RF power. For example, in one embodiment, a substrate is positioned on a substrate support in a processing chamber, a gas mixture comprising an organosilicon compound is introduced into the processing chamber, and then RF power is initiated in the processing chamber by ramping up the RF power, such as at a rate of between about 50 W/sec and about 500 W/sec in a 200 mm chamber, which is equivalent to ramping up the RF power density at a rate of between about 0.16 W/cm$^2$/sec and about 1.6 W/cm$^2$/sec. The substrate is then moved such that it is located at a different distance from a gas distribution manifold of the chamber, and the gas mixture comprising an organosilicon compound is reacted in the processing chamber in the presence of RF power to deposit an organosilicate layer on the substrate. In another embodiment, a substrate is positioned on a substrate support in a processing chamber, and a gas mixture comprising an organosilicon compound is introduced into the processing chamber. RF power is initiated in the chamber, and then the substrate is moved such that it is located at a different distance from a gas distribution manifold of the chamber. The gas mixture is reacted in the processing chamber in the presence of RF power to deposit an organosilicate layer on the substrate. The substrate is then moved to another distance from a gas distribution manifold of the chamber, and the RF power is terminated by ramping down the RF power, such as at a rate of between about 50 W/sec and about 500 W/sec in a 200 mm chamber, which is equivalent to ramping down the RF power density at a rate of between about 0.16 W/cm$^2$/sec and about 1.6 W/cm$^2$/sec. In a further embodiment of depositing an organosilicate layer on a substrate, RF power is initiated in the processing chamber by ramping up the RF power, and the RF power is terminated by ramping down the RF power.

Precursors and Processing Conditions for Deposition of Organosilicate Layers

In any of the embodiments described herein, an organosilicate layer is deposited from a gas mixture comprising an organosilicon compound. The organosilicate layer may be used as a dielectric layer. The dielectric layer may be used at different levels within a device. For example, the dielectric layer may be used as a premetal dielectric layer, an intermetal dielectric layer, or a gate dielectric layer. The organosilicate layer is preferably a low k dielectric layer, i.e., having a dielectric constant of less than about 3.

A wide variety of gas mixtures may be used to deposit the organosilicate layer, and non-limiting examples of such gas mixtures are provided below. Generally, the gas mixture may include a second organosilicon compound, an oxidizing gas, a hydrocarbon, or combinations thereof.

In one embodiment, an organosilicate layer is deposited from a gas mixture comprising a cyclic organosilicon compound, one or more aliphatic compounds, and one or more oxidizing gases. The one or more aliphatic compounds may include an aliphatic organosilicon compound, an aliphatic hydrocarbon, or a mixture thereof. Preferably, the gas mixture comprises octamethylcyclotetrasiloxane, trimethylsilane, ethylene, and oxygen. Further description of deposition of an organosilicate layer from such a gas mixture is provided in U.S. patent application Ser. No. 10/121,284, filed Apr. 11, 2002, which is commonly assigned and is incorporated by reference herein.

In another embodiment, an organosilicate layer is deposited from a gas mixture including one or more organosilicon compounds, one or more hydrocarbon compounds having at least one cyclic group, and one or more oxidizing gases. For example, the gas mixture may include diethoxymethylsilane, alpha-terpinene, oxygen, and carbon dioxide. Further description of deposition of an organosilicate layer from such a gas mixture is provided in U.S. patent application Ser. No. 10/302,393, filed Nov. 22, 2002, which is commonly assigned and is incorporated by reference herein.

In another embodiment, an organosilicate layer is deposited from a gas mixture including an organosilicon compound and an oxidizing gas. Further description of deposition of an organosilicate layer from such a gas mixture is provided in U.S. Pat. No. 6,348,725, filed Feb. 10, 1999 and issued Feb. 19, 2002, which is commonly assigned and is incorporated by reference herein.

Although any of the gas mixtures described above may be used, for simplicity, chamber processing conditions will be described with respect to a preferred mixture comprising a cyclic organosilicon compound, an aliphatic organosilicon compound, an aliphatic hydrocarbon, and an oxidizing gas. The cyclic organosilicon compound may be introduced into the processing chamber at a flowrate of about 10 to about 10,000 sccm. The aliphatic organosilicon compound may be introduced into the processing chamber at a flowrate of about 10 to about 1,000 sccm. The aliphatic hydrocarbon may be introduced into the processing chamber at a flowrate of about 10 to about 10,000 sccm. The oxidizing gas has a flowrate between about 10 and about 6,000 sccm.

A controlled plasma is typically formed in the chamber adjacent to the substrate by RF energy applied to the gas distribution manifold using an RF power supply. Alternatively, RF power can be provided to the substrate support. The RF power to the chamber may be cycled or pulsed to reduce heating of the substrate and promote greater porosity in the deposited film. The power density of the plasma for a 200 mm substrate is between about 0.03 W/cm$^2$ and about 3.2 W/cm$^2$, which corresponds to a RF power level of about 10 W to about 2,000 W. Preferably, the RF power level is between about 300 W and about 1,700 W.

The RF power supply 25 can supply a single frequency RF power between about 0.01 MHz and 300 MHz, such as 13.56 MHz. Alternatively, the RF power may be delivered using mixed, simultaneous frequencies to enhance the decomposition of reactive species introduced into the high vacuum region 15. In one aspect, the mixed frequency is a lower frequency of about 12 kHz and a higher frequency of about 13.56 mHz. In another aspect, the lower frequency may range between about 300 Hz to about 1,000 kHz, and the higher frequency may range between about 5 mHz and about 50 mHz.

During deposition, the substrate is maintained at a temperature between about −20° C. and about 500° C., preferably between about 100° C. and about 450° C. The deposition pressure is typically between about 1 Torr and about 20 Torr, preferably between about 4 Torr and about 7 Torr. The deposition rate is typically between about 2,000 Å/min and about 20,000 Å/min.

In embodiments in which the distance between the substrate and the gas distribution manifold remains constant through the initiation of RF power, deposition of the organosilicate layer, and the termination of RF power, the distance between the substrate and the gas distribution manifold, i.e., the spacing, may be about 200 mils to about 1200 mils. In embodiments in which the spacing is varied between the initiation of RF power and deposition of the organosilicate layer, the spacing may be about 200 mils to about 600 mils during the initiation of RF power and about 600 mils to about 1200 mils during the deposition of the organosilicate layer and termination of RF power. In embodiments in which the spacing is varied between the deposition of the organosilicate layer and termination of RF power, the spacing may be about 300 mils to about 1200 mils during the initiation of RF power and during the deposition of the organosilicate layer and about 600 mils to about 1000 mils during the termination of RF power. In embodiments in which the spacing is varied through the initiation of RF power, deposition of the organosilicate layer, and the termination of RF power, the spacing may be about 200 mils to about 600 mils during the initiation of RF power, about 700 mils to about 1200 mils during the deposition of the organosilicate layer, and about 400 mils to about 800 mils during the termination of RF power.

In embodiments in which an organosilicon compound of the gas mixture is introduced into the chamber after the initiation of RF power and/or the flow of the organosilicon compound is terminated before the termination of RF power, the organosilicon compound may be introduced into the chamber about 1 second to about 5 seconds after the initiation of RF power. The flow of the organosilicon compound into the chamber may be terminated about 1 second to about 5 seconds before the termination of RF power.

EXAMPLES

The following examples illustrate embodiments of the present invention. The organosilicate layers were deposited using a chemical vapor deposition chamber that is part of an integrated processing platform. In particular, the films were deposited using a DLK chamber on a 200 mm PRO-DUCER® system, available from Applied Materials, Inc. of Santa Clara, Calif.

Example 1

An organosilicate layer was deposited on a substrate from the following gas mixture at a chamber pressure of about 5.75 Torr and substrate temperature of 400° C.:

Octamethylcyclotetrasiloxane (OMCTS), at about 520 sccm;

Trimethylsilane (TMS), at about 300 sccm,

Ethylene, at about 2,200 sccm;

Oxygen, at about 1,000 sccm; and

Helium, at about 1,000 sccm.

The substrate was positioned 300 mils from the gas distribution manifold, and RF power of 2.5 W/cm$^2$ (800 W) at a frequency of 13.56 MHz was applied to the manifold. The gas mixture described above was introduced into the chamber before the initiation of RF power. After initiation of the RF power for about 2 seconds, the substrate was positioned 1050 mils from the gas distribution manifold for deposition of the organosilicate layer in about 20 seconds. The substrate was then positioned 700 mils from the gas distribution manifold, and the RF power was terminated in about 2 seconds, while maintaining the chamber pressure. The chamber throttle valve was opened after the RF power termination was completed to allow the gas mixture to be pumped out of the chamber.

Example 2

An organosilicate layer was deposited on a substrate from the following reactive gases at a chamber pressure of about 5.75 Torr and substrate temperature of 400° C.:

Octamethylcyclotetrasiloxane (OMCTS), at about 520 sccm;

Trimethylsilane (TMS), at about 300 sccm;

Ethylene, at about 2,200 sccm;

Oxygen, at about 1,000 sccm; and

Helium, at about 1,000 sccm.

The substrate was positioned 1020 mils from the gas distribution manifold, and RF power of 2.5 W/cm$^2$ (800 W) at a frequency of 13.56 MHz was applied to the manifold. The gas mixture described above was introduced into the chamber before the initiation of RF power. After initiation of the RF power for about 2 seconds, the organosilicate layer was deposited in about 20 seconds. The substrate was then positioned 700 mils from the gas distribution manifold, and the RF power was terminated in about 2 seconds. The chamber pressure was maintained at about 5.75 Torr and the gas mixture was retained in the chamber during the RF power termination. After the RF power was terminated, the flow of the gas mixture into the chamber was terminated. The chamber throttle valve was opened after the RF power termination was completed to allow the gas mixture to be pumped out of the chamber.

Example 3

An organosilicate layer was deposited on a substrate from the following reactive gases at a chamber pressure of about 5.75 Torr and substrate temperature of 400° C.:

Octamethylcyclotetrasiloxane (OMCTS), at about 520 sccm;

Trimethylsilane (TMS), at about 300 sccm;

Ethylene, at about 2,200 sccm;

Oxygen, at about 1,000 sccm; and

Helium, at about 1,000 sccm.

The substrate was positioned 1020 mils from the gas distribution manifold, and RF power of 2.5 W/cm$^2$ (800 W) at a frequency of 13.56 MHz was applied to the manifold. The gas mixture described above was introduced into the chamber before the initiation of RF power. After initiation of the RF power for about 2 seconds, the organosilicate layer was deposited in about 20 seconds. The flow of the octamethylcyclotetrasiloxane and the trimethylsilane was terminated, and then the RF power was terminated in about 2 seconds while maintaining the chamber pressure. After the RF power was terminated, the flow of the rest of the gas mixture into the chamber was terminated. The chamber throttle valve was opened after the RF power termination was completed to allow the gas mixture to be pumped out of the chamber.

Comparative Example 1

An organosilicate layer was deposited on a substrate from the following reactive gases at a chamber pressure of about 5.75 Torr and substrate temperature of 400° C.:

Octamethylcyclotetrasiloxane (OMCTS), at about 520 sccm;

Trimethylsilane (TMS), at about 300 sccm:

Ethylene, at about 2,200 sccm;

Oxygen, at about 1,000 sccm; and

Helium, at about 1,000 sccm.

The substrate was positioned 1020 mils from the gas distribution manifold, and RF power of 2.5 W/cm$^2$ (800 W) at a frequency of 13.56 MHz was applied to the manifold. The gas mixture described above was introduced into the chamber before the initiation of RF power. After initiation of the RF power for about 2 seconds, the organosilicate layer was deposited in about 20 seconds. The RF power was then terminated in about 2 seconds with the chamber throttle valve opened to allow the gas mixture to be pumped out of the chamber.

Figure 5:
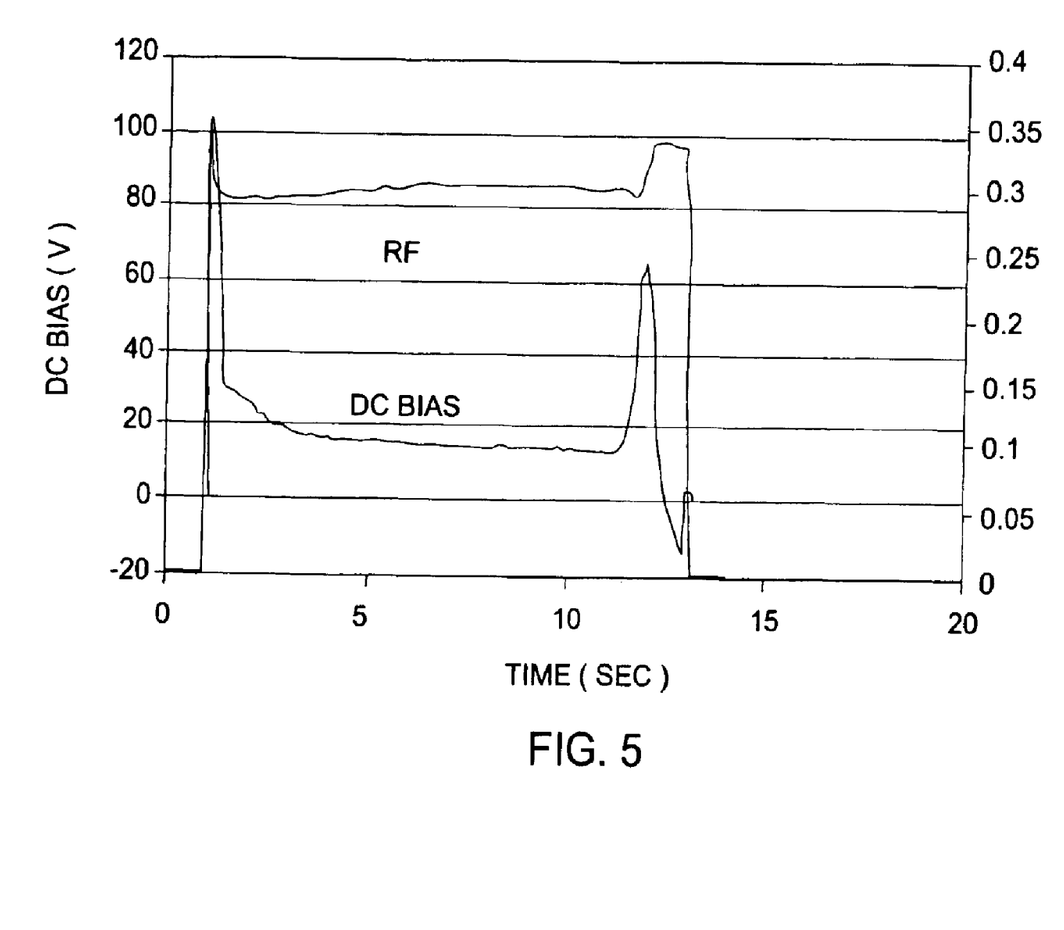
FIG. 5 is a DC bias trace obtained during a method of the prior art.
Figure 6:
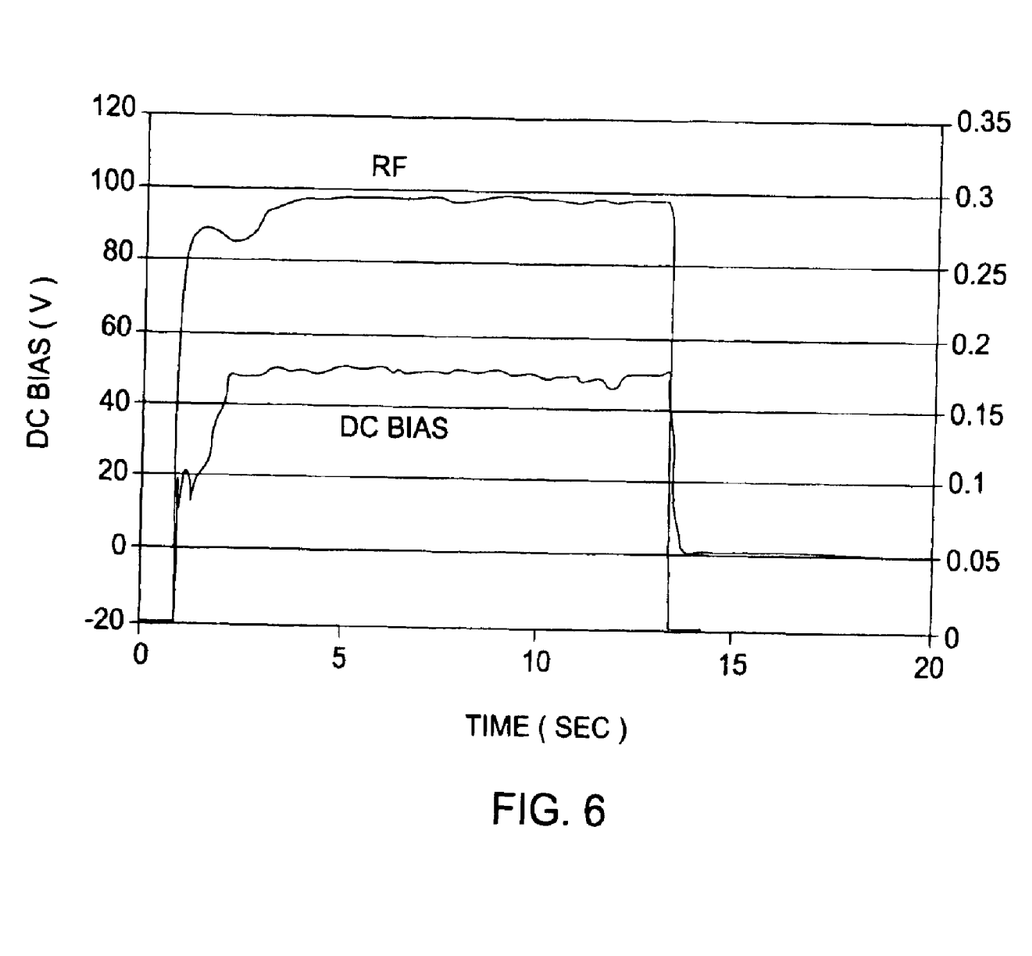
FIG. 6 is a DC bias trace obtained during a first example incorporating an embodiment of the invention.
Figure 7:
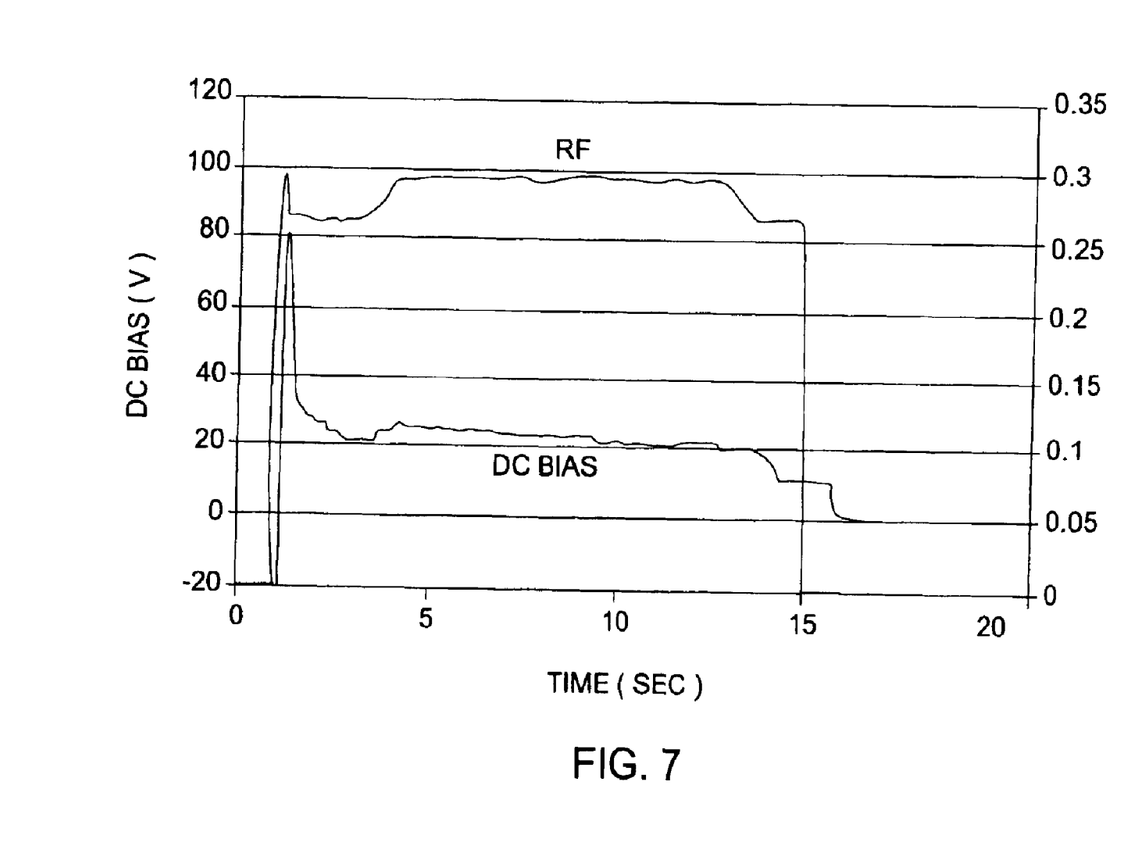
FIG. 7 is a DC bias trace obtained during a second example incorporating an embodiment of the invention.
Figure 8:
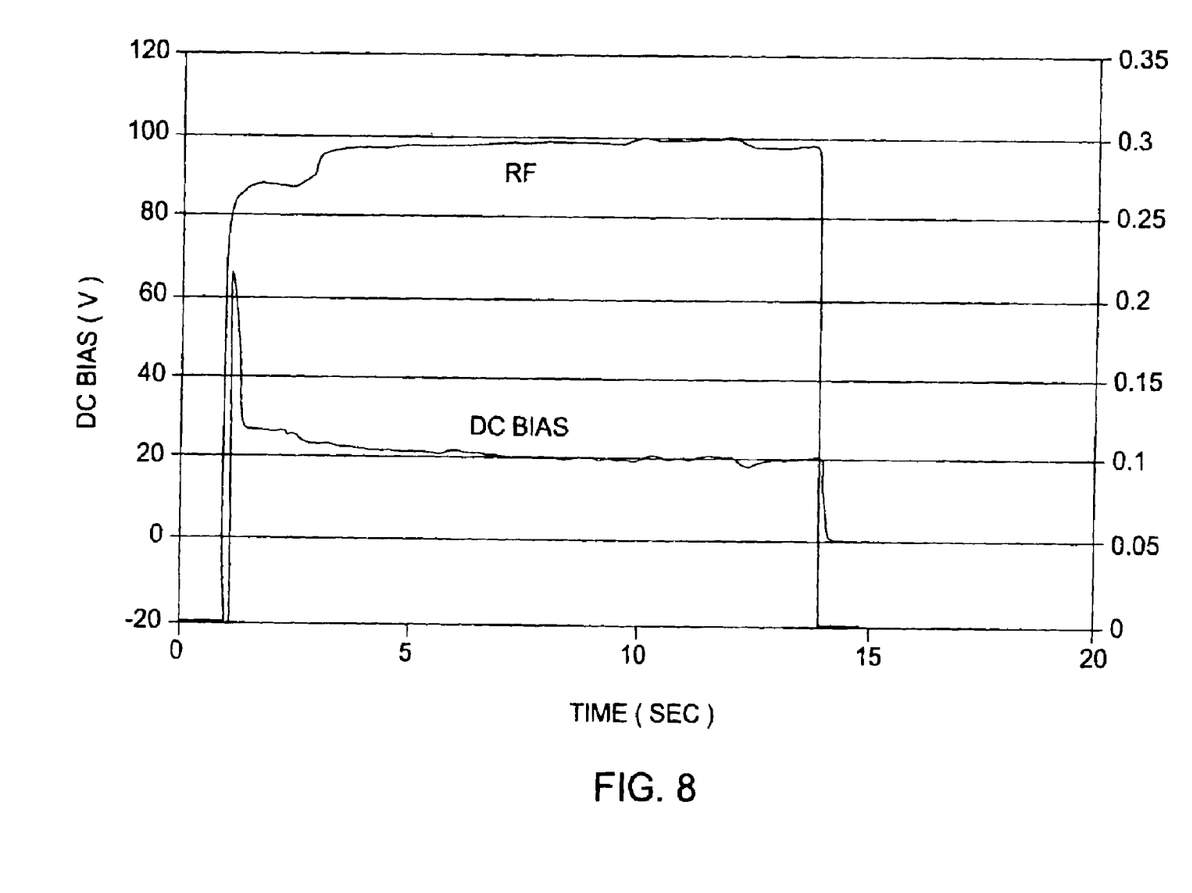
FIG. 8 is a DC bias trace obtained during a third example incorporating an embodiment of the invention.

FIGS. 5–8 depict the DC bias traces of the gas distribution manifold for the processes of comparative example 1 and examples 1–3, respectively. FIG. 5 shows large DC bias spikes at the time points corresponding to the initiation and termination of RF power in comparative example 1. FIG. 6 shows essentially no DC bias spikes during the process of example 1. FIG. 7 shows essentially no DC bias spike during the process of example 2 at the time point corresponding to the termination of RF power and a smaller DC bias spike at the initiation of RF power compared to FIG. 5 and comparative example 1. FIG. 8 shows essentially no DC bias spike during the process of example 3 at the time point corresponding to the termination of RF power and a smaller DC bias spike at the initiation of RF power compared to FIG. 5 and comparative example 1.

As it is believed that reducing or eliminating DC bias spikes reduces plasma-induced damage to substrates, it is believed that processes performed according to the embodiments described herein, such as in examples 1–3, reduce plasma-induced damage to substrates. 33% of integrated circuit devices having an organosilicate layer formed according to the process of comparative example 1 had acceptable electrical characteristics, such as good leakage current and breakdown voltages, while 100% of integrated circuit devices having an organosilicate layer formed according to the process of example 1 had acceptable electrical characteristics.

Typically, the processes described herein reduce the size of DC bias spikes, i.e., the difference between the peak and trough of a spike, to less than about 80 V. Preferably, the processes described herein reduce the size of DC bias spikes to less than about 50 V. Preferably, the DC bias changes at a rate of less than about 50 V/sec.

The average voltage and the difference between the maximum and minimum voltage of the substrates processed according to examples 1–3 and comparative example 1 were also measured to detect large voltages and voltage differences across substrates that may contribute to plasma-induced damage. The average voltage of a substrate processed according to comparative example 1 was –0.105 V, and the voltage difference across the substrate was 2.14V. The average voltage of a substrate processed according to example 1 was 0.061 V, and the voltage difference across the substrate was 0.73 V. The average voltage of a substrate processed according to example 2 was 0.061 V, and the voltage difference across the substrate was 0.73 V. The average voltage of a substrate processed according to example 3 was 0.054 V, and the voltage difference across the substrate was 0.57 V. Thus, the processes described herein reduced the average voltage of a substrate and the voltage difference across the substrate relative to comparative example 1.

While not being bound by theory, it is believed that reducing the distance between the substrate and the gas distribution manifold, as described above, results in a more stable plasma that is less likely to cause substrate damage. It is also believed that maintaining chamber pressure during the termination of RF power contributes to a more stable plasma that is less likely to cause substrate damage than a plasma in a chamber that experiences an abrupt change in pressure, such as a pressure drop caused by opening a chamber throttle valve.

While the foregoing is directed to embodiments of the present invention, other and further embodiments of the invention may be devised without departing from the basic scope thereof, and the scope thereof is determined by the claims that follow.

What is claimed is:

1. A method of depositing an organosilicate layer on a substrate, comprising:

reacting a gas mixture comprising an organosilicon compound in a processing chamber in the presence of RF power under conditions sufficient to deposit an organosilicate layer on a substrate disposed on a substrate support in the processing chamber, wherein the conditions comprise varying a distance between the substrate and a gas distribution manifold of the processing chamber.

2. The method of claim 1, wherein the conditions comprise initiating the RF power in the processing chamber while the substrate is at a first distance from the gas distribution manifold and depositing the organosilicate layer on the substrate while the substrate is at a second distance from the gas distribution manifold.

3. The method of claim 2, wherein the conditions further comprise terminating the RF power in the processing chamber while the substrate is at a third distance from the gas distribution manifold.

4. The method of claim 1, wherein the conditions comprising depositing the organosilicate layer on the substrate while the substrate is at a first distance from the gas distribution manifold and terminating the RF power in the processing chamber while the substrate is at a second distance from the gas distribution manifold.

5. The method of claim 1, wherein the gas mixture further comprises an oxidizing gas.

6. The method of claim 5, wherein the gas mixture further comprises a hydrocarbon.

7. The method of claim 5, wherein the gas mixture further comprises another organosilicon compound.

8. The method of claim 1, wherein the gas mixture comprises octamethylcyclotetrasiloxane, trimethylsilane, oxygen, and ethylene.

9. The method of claim 1, further comprising initiating the RF power in the processing chamber and introducing the organosilicon compound into the processing chamber, wherein the organosilicon compound is introduced into the processing chamber after the RF power is initiated.

10. The method of claim 1, further comprising terminating the RF power in the processing chamber, wherein a flow of the organosilicon compound into the processing chamber is terminated before the RF power is terminated.

11. The method of claim 1, further comprising terminating the RF power in the processing chamber, wherein a pressure of the chamber is maintained during termination of the RF power.

12. The method of claim 1, wherein the conditions further comprise initiating the RF power in the processing chamber by ramping up the RF power.

13. The method of claim 1, wherein the conditions further comprise terminating the RF power by ramping down the RF power after reacting the gas mixture.

14. A method of depositing an organosilicate layer on a substrate, comprising:
positioning a substrate on a substrate support in a processing chamber comprising a gas distribution manifold;
initiating RF power in the processing chamber;
reacting a gas mixture comprising an organosilicon compound in the processing chamber in the presence of RF power to deposit an organosilicate layer on the substrate; and then
terminating the RF power in the processing chamber, wherein the substrate is positioned further from the gas distribution manifold during the reacting a gas mixture than during the initiating RF power, and the substrate is positioned closer to the gas distribution manifold during the terminating the RF power than during the reacting a gas mixture.

15. The method of claim 14, wherein the substrate is positioned further from the gas distribution manifold during the terminating the RF power than during the initiating the RF power.

16. The method of claim 14, wherein the organosilicon compound is a cyclic organosilicon compound, and the gas mixture further comprises one or more aliphatic compounds and one or more oxidizing gases.

17. A method of depositing an organosilicate layer on a substrate, comprising:

reacting a gas mixture comprising an organosilicon compound in a processing chamber comprising a gas distribution manifold in the presence of RF power under conditions sufficient to deposit an organosilicate layer on a substrate disposed on a substrate support in the processing chamber such that a DC bias of the gas distribution manifold changes at a rate of less than about 50 V/sec.

18. The method of claim 17, wherein the conditions comprise varying a distance between the substrate and a gas distribution manifold of the processing chamber.

19. The method of claim 17, wherein the conditions comprising depositing the organosilicate layer on the substrate while the substrate is at a first distance from the gas distribution manifold and terminating the RF power in the processing chamber while the substrate is at a second distance from the gas distribution manifold.

20. The method of claim 17, wherein the gas mixture further comprises a hydrocarbon.

21. A method of depositing an organosilicate layer on a substrate, comprising: initiating RF power in a processing chamber comprising a gas distribution manifold; and
reacting a gas mixture comprising an organosilicon compound in the processing chamber in the presence of the RF power to deposit an organosilicate layer on a substrate disposed on a substrate support in the processing chamber, wherein the organosilicon compound is introduced into the processing chamber after the RF power is initiated.

22. The method of claim 21, wherein the gas mixture further comprises an oxidizing gas.

23. The method of claim 21, further comprising terminating the RF power in the processing chamber, wherein a pressure of the chamber is maintained during termination of the RF power.

24. The method of claim 21, further comprising terminating the flow of the organosilicon compound into the processing chamber and then terminating the RF power.

25. The method of claim 21, wherein the RF power is initiated by ramping up the RF power.

26. The method of claim 21, further comprising terminating the RF power by ramping down the RF power after reacting the gas mixture.

27. A method of depositing an organosilicate layer on a substrate, comprising:
reacting a gas mixture comprising an organosilicon compound in a processing chamber comprising a gas distribution manifold in the presence of RF power to deposit an organosilicate layer on a substrate disposed on a substrate support in the processing chamber; and
terminating the RF power in the processing chamber, wherein a flow of the organosilicon compound into the processing chamber is terminated before the RF power is terminated.

28. The method of claim 27, wherein the gas mixture further comprises an oxidizing gas.

29. The method of claim 27, wherein a pressure of the chamber is maintained during termination of the RF power.

30. The method of claim 27, wherein the RF power is initiated by ramping up the RF power.

31. The method of claim 27, wherein the RF power is terminated by ramping down the RF power.

* * * * *

UNITED STATES PATENT AND TRADEMARK OFFICE
CERTIFICATE OF CORRECTION

PATENT NO. : 6,911,403 B2 Page 1 of 1
APPLICATION NO. : 10/645675
DATED : June 28, 2005
INVENTOR(S) : Lihua Li et al.

It is certified that error appears in the above-identified patent and that said Letters Patent is hereby corrected as shown below:

In the Specification

Column 3, Line 35: Change "PRODUCERS" to --PRODUCER˙--

Signed and Sealed this

First Day of August, 2006

JON W. DUDAS
*Director of the United States Patent and Trademark Office*